United States Patent
Redaelli et al.

(10) Patent No.: US 10,157,667 B2
(45) Date of Patent: Dec. 18, 2018

(54) MIXED CROSS POINT MEMORY

(71) Applicant: Micron Technology, Inc., Boise, ID (US)

(72) Inventors: Andrea Redaelli, Casatenovo (IT); Innocenzo Tortorelli, Cernusco sul Naviglio (IT); Agostino Pirovano, Milan (IT); Fabio Pellizzer, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/582,321

(22) Filed: Apr. 28, 2017

(65) Prior Publication Data

US 2018/0315474 A1 Nov. 1, 2018

(51) Int. Cl.
G11C 5/06 (2006.01)
G11C 13/00 (2006.01)
G11C 11/56 (2006.01)

(52) U.S. Cl.
CPC ...... *G11C 13/0004* (2013.01); *G11C 11/5678* (2013.01); *G11C 13/004* (2013.01); *G11C 13/0026* (2013.01); *G11C 13/0028* (2013.01); *G11C 13/0069* (2013.01)

(58) Field of Classification Search
None
See application file for complete search history.

(56) References Cited

U.S. PATENT DOCUMENTS

| 9,318,699 | B2 | 4/2016 | Pellizzer et al. |
| 2011/0278527 | A1* | 11/2011 | Ishibashi .......... H01L 21/76838 257/1 |
| 2016/0276022 | A1 | 9/2016 | Redaelli |
| 2016/0276023 | A1* | 9/2016 | Chen .................... G11C 13/004 |
| 2018/0096979 | A1* | 4/2018 | Pappu .................... H01L 25/18 |

OTHER PUBLICATIONS

Chen et al., "An Access-Transistor-Free (0T/1R) Non-Volatile Resistance Random Access Memory (RRAM) Using a Novel Threshold Switching, Self-Rectifying Chalcogenide Device," Electron Devices Meeting, 2003. IEDM '03 Technical Digest. IEEE International, Dec. 8-10, 2003, 4 pgs., IEEE.

* cited by examiner

*Primary Examiner* — Uyen B Tran
(74) *Attorney, Agent, or Firm* — Holland & Hart LLP

(57) ABSTRACT

Methods, systems, and devices for multi-deck memory arrays are described. A multi-deck memory device may include a memory array with a cell having a self-selecting memory element and another array with a cell having a memory storage element and a selector device. The device may be programmed to store multiple combinations of logic states using cells of one or more decks. Both the first deck and second deck may be coupled to at least two access lines and may have one access line that is a common access line, coupling the two decks. Additionally, both decks may overlie control circuitry, which facilitates read and write operations. The control circuitry may be configured to write a first state or a second state to one or both of the memory decks via the access lines.

10 Claims, 6 Drawing Sheets

MIXED CROSS POINT MEMORY

BACKGROUND

The following relates generally to multi-deck memory arrays and more specifically to mixed cross point memory.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., flash memories, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

Phase change memory may be non-volatile in nature and may offer improved read and write speeds compared to other memory devices, as well as increased memory cell density. Self-selecting memory may allow for faster programming times while utilizing a lower programming current. Other types of phase change memory, like those that employ separate memory storage elements and selectors, may have certain beneficial properties that are different from self-selecting memory. So a device may be constrained in certain respects based on the type of phase change memory cell employed.

DETAILED DESCRIPTION

A multi-deck memory device with an array having self-selecting memory cells and an array having nonvolatile memory (e.g., phase change memory, flash memory, ferroelectric memory) cells with a separate memory storage element and selector device may allow for improved read and write speeds, increased memory cell density, faster programming times, lower programming current, and increased storage capacity. That is, the benefits of both self-selecting memory and other three-dimensional cross point architectures may be realized by including arrays of both cell types in a device.

Self-selecting memory may leverage ion migration properties of chalcogenide materials for programming and subsequently sensing a logic state. A self-selecting memory cell may include a memory storage element coupled between a first electrode and a second electrode. When a particular self-selecting memory cell is programmed, elements within the device separate, causing certain ions of an element to migrate towards a particular electrode, depending on the given cell's polarity. For example, ions may migrate towards the negative electrode of an element, which may alter its local composition of ions. The memory cell may then be read by applying a voltage across the cell to sense which electrode ions have migrated towards.

Phase change memory using a separate memory storage element and selector device in each cell may have different write-time performance characteristics than self-selecting memory and may perform well as storage class memory. This type of memory may, for example, be employed for long term data storage, in a manner similar to a NAND flash hard drive, while self-selecting memory may be employed for more time-sensitive operations, similar to random access memory (RAM) tasks. Phase change memory with a separate storage element and selector may be programmed to different logic states using programming pulses of different amplitude and/or duration; for example, the storage element of a phase change memory may be switched between a substantially crystalline state and a substantially amorphous state, respectively characterized by a low resistivity and a high resistivity. In some examples, a phase change memory with a separate storage element and selector may be programmed to different logic states using programming pulses of different polarities. In some cases, cells with separate storage and selector may be programmed with two logic states.

Features and techniques introduced above are further described below in the context of a memory array. Specific examples are then described for multi-deck memory arrays that include both self-selecting memory and other phase change memory cells. These and other features of the disclosure are further illustrated by and described with reference to apparatus diagrams, system diagrams, and flowcharts that relate to reading or writing such arrays.

Figure 1:
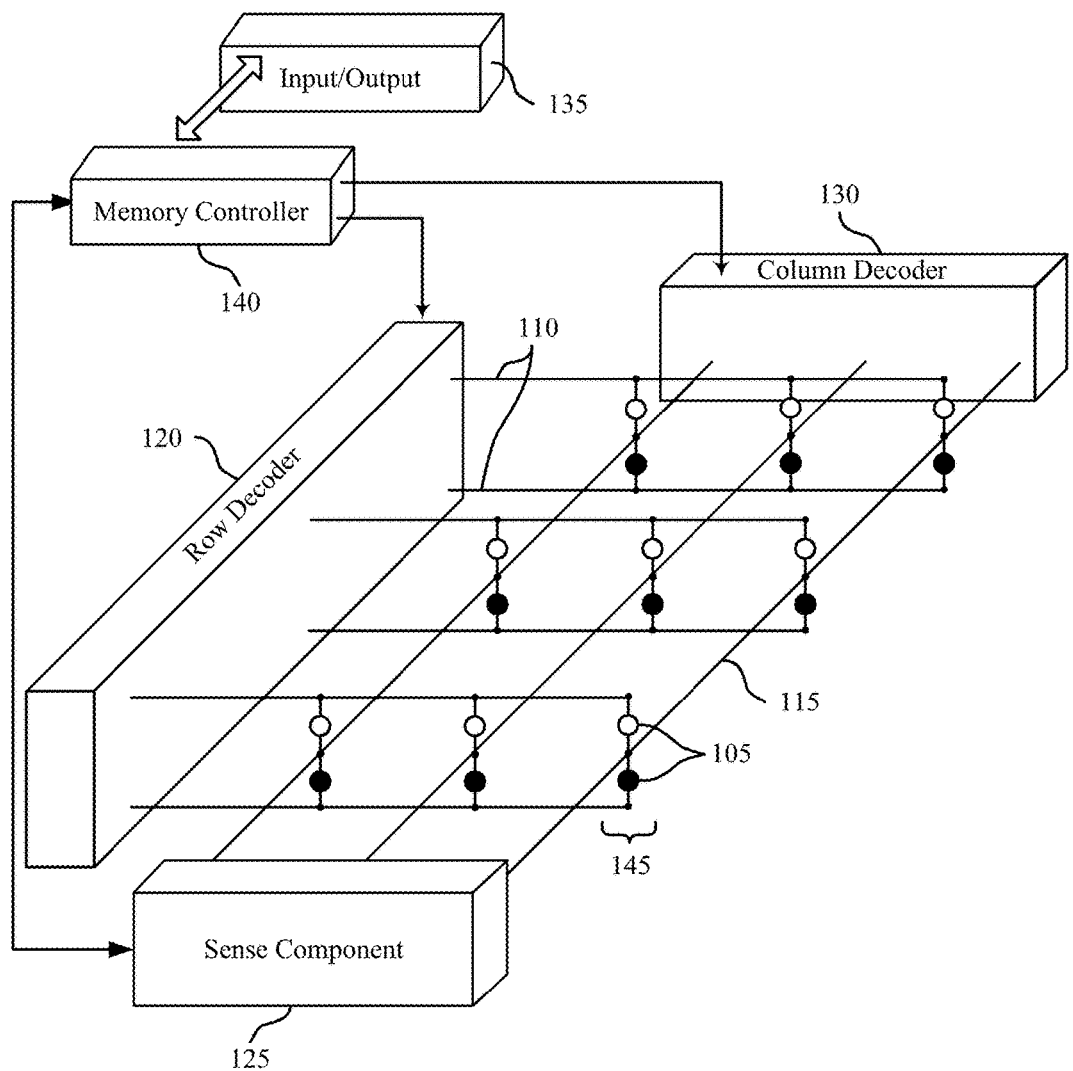
FIG. 1 illustrates an exemplary mixed cross point memory device that supports features and operations in accordance with examples of the present disclosure.

FIG. 1 illustrates an example memory device 100 that supports features and operations in accordance with examples of the present disclosure. Memory device 100 may also be referred to as an electronic memory apparatus. Memory device 100 includes memory cell 105 that are programmable to store different states. Memory cells 105 may be self-selecting memory cells or may be cells that include a memory storage element and a selector device, as described with reference to FIG. 2. Memory device 100 may have a first array of memory cells 105 (e.g., self-selecting memory cells) that overlies a second array of cells 105. Alternatively, the second array of cells 105 may overlie the first array of memory cells 105. Each cell of the first array may correspond to one cell of the second array where the first array and the second array overlie a control circuitry (e.g., interface 315 described with reference to FIG. 3).

A first array of cells may be referred to as first memory deck and second array of cells may be referred to as second memory deck.

A memory cell 105 may include a material, which may be referred to as a memory element, memory storage element, or a self-selecting memory storage element that has a variable and configurable electrical resistance (e.g., a variable and configurable threshold voltage) that is representative of the logic states. For example, a material with a crystalline or an amorphous atomic configuration may have different electrical resistances. A crystalline state may have a low electrical resistance and may, in some cases, be referred to as the "set" state. An amorphous state may have a high electrical resistance and may be referred to as the "reset" state. A voltage applied to the memory cell 105 may thus result in different currents depending on whether the material is in a crystalline or an amorphous state, and the magnitude of the resulting current may be used to determine the logic state stored by memory cell 105.

In some cases, a material in both the amorphous and crystalline state may have a threshold voltage associated with it—that is, current flows after the threshold voltage is exceed. For example, self-selecting memory may enhance differences in a threshold voltage of the memory cell between different programmed states. Thus, if the applied voltage is less than the threshold voltage, no current may flow if the memory element is in the amorphous (e.g., reset) state; if the memory element is in the crystalline (e.g., set) state, it may have a different threshold voltage and, thus, a current may flow in response to the applied voltage.

To program a cell 105 with a self-selecting memory element, programming pulses of different polarities may be applied to the cell 105. For example, to program a logic "1" state, a first polarity may be applied and to program a logic "0" state, a second polarity may be applied. The first polarity and the second polarity may be opposite polarities. To read a cell 105 with a self-selecting memory storage element, a voltage may be applied across memory cell 105 and the resulting current or the threshold voltage at which current begins to flow may be representative of a logic "1" or a logic "0" state. The crowding of selenium and arsenic ions as one or the other ends of memory storage element may affect the conduction properties and thus the threshold voltage. In some examples, a threshold voltage of a cell changes depending on a polarity used to program the cell. For example, a self-selecting memory cell programmed with one polarity may have certain resistive properties and thus one threshold voltage. And that self-selecting memory cell may be programmed with a different polarity that may result in different resistive properties of the cell and thus a different threshold voltage. Thus, when a self-selecting memory cell is programmed, elements within the cell may separate, causing ion migration. Ions may migrate towards a particular electrode, depending on the given cell's polarity. For example, in a self-selecting memory cell, some ions may migrate towards the negative electrode. The memory cell may then be read by applying a voltage across the cell to sense which electrode ions have migrated towards.

In other cases, the memory cell 105 may have a combination of crystalline and amorphous areas that may result in intermediate resistances, which may correspond to different logic states (i.e., states other than logic 1 or logic 0) and may allow memory cells 105 to store more than two different logic states. As discussed below, the logic state of a memory cell 105 may be set by heating, including melting, the memory element.

Memory device 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory device 100 includes two decks of memory cells 105 and may thus be considered a three-dimensional memory array; however, the number of decks is not limited to two. Each deck may be aligned or positioned so that memory cells 105 may be approximately aligned with one another across each deck, forming a memory cell stack 145. Alternatively, for example, memory device 100 may include two decks of memory cells 105 in which the pitch of the first deck may be different than the pitch of the second deck. The pitch of the first deck, for example, may be smaller than the pitch of the second deck.

According to the example, of FIG. 1, each row of memory cells 105 is connected to an access line 110, and each column of memory cells 105 is connected to a bit line 115. Access lines 110 may also be known as word lines 110, and bit lines 115 may also be known digit lines 115. Word lines 110, bit lines 115, and digit lines 115 may each be referred to as access lines. References to word lines and bit lines, or their analogues, are interchangeable without loss of understanding or operation. Word lines 110 and bit lines 115 may be substantially perpendicular to one another to create an array. As shown in FIG. 1, the two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. In some cases, (not shown) each array may have its own access lines; e.g., each array may have word lines and digit lines that are not in commons with access lines coupled to different arrays. Other configurations may be possible; for example, a third layer may share a word line 110 with a lower layer.

In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, a word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100.

Operations such as reading and writing may be performed on memory cells 105 by activating or selecting a word line 110 and bit line 115, which may include applying a voltage or a current to the respective line. Additionally, read and write operations may be performed on both the first memory deck and second memory deck by activating a word line 110 or a bit line 115. Word lines 110 and bit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125 to determine the stored state of the memory cell 105. Additionally, sense component 125 may determine the stored state of a memory cell 105 located in the first memory deck and the stored state of a memory cell 105 located in the second memory deck. For example, the first memory deck may be accessed via a first access line (e.g., word line 110-a) and the second memory deck may be accessed via a second access line (e.g., word line 110-b), as described below with reference to FIG. 2. Sense component 125 may include various transistors or amplifiers in order to detect and amplify a difference in the signals, which may be referred to as latching. The detected logic state of memory cell 105 may then be output through column decoder 130 as input/output 135. In some cases, sense component 125 may be a part of column decoder 130 or row decoder 120. Or, sense component 125 may be connected to or in electronic communication with column decoder 130 or row decoder 120.

A memory cell 105 may be set, or written, by similarly activating the relevant word line 110 and bit line 115—i.e., a logic value may be stored in the memory cell 105. Column decoder 130 or row decoder 120 may accept data, for example input/output 135, to be written to the memory cells 105. Additionally, a first memory deck and a second memory deck may be individually written by activating the relevant word line 110 and bit line 115.

In the case of phase change memory (PCM), a memory cell 105 is written by heating the memory storage element, for example, by passing a current through the memory storage element. The memory storage element may then be quenched to an amorphous phase. In the case of self-selecting memory, programming pulses of different polarities, which may represent a logic "1" or a logic "0" state, may be applied to the memory cell 105 to modify the threshold voltage of the cell 105. Depending on the logic state written to memory cell 105—e.g., logic "1" or logic "0"—selenium ions may crowd at or near a particular electrode. Alternatively stated, the local composition of a chalcogenide material may be modified at each electrode. For example, dependent on the polarity of memory cell 105, ion crowding at or near a first electrode may result in a first threshold voltage representative of a logic "1" state and ion crowding at or near a second electrode may result in a second threshold voltage, different from the first, representative of a logic "0" state. Writing memory cells 105 may be done using different voltage polarities across the cell 105. The polarity of a voltage pulse may affect the logic state written to a cell 105.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM and/or self-selecting memory, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile PCM and/or self-selecting memory cells may have beneficial properties that may result in improved performance relative to other memory architectures. For example, PCM and/or self-selecting memory may offer comparable read/write speeds as DRAM but may be non-volatile and allow for increased cell density.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltages or currents used during the operation of memory device 100. For example, it may apply discharge voltages to a word line 110 or bit line 115 after accessing one or more memory cells 105.

In general, the amplitude, polarity, shape, or duration of an applied voltage or current discussed herein may be adjusted or varied and may be different for the various operations discussed in operating memory device 100. Furthermore, one or multiple memory cells 105 within memory device 100 may be accessed simultaneously; for example, multiple or all cells of memory device 100 may be accessed simultaneously during a reset operation in which all memory cells 105, or a group of memory cells 105, are set to a logic state.

Figure 2:
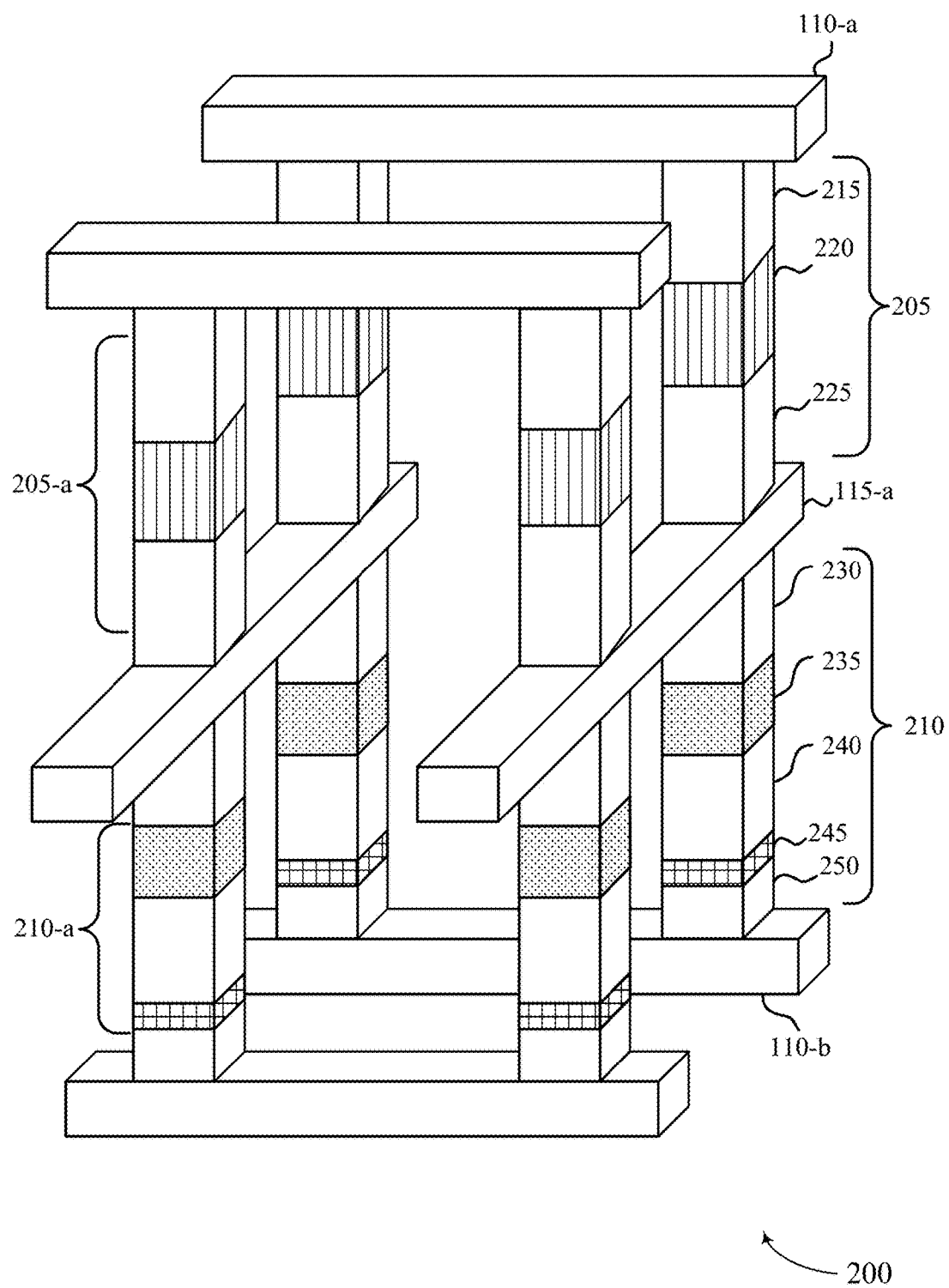
FIG. 2 illustrates an exemplary mixed cross point memory device that supports features and operations in accordance with examples of the present disclosure.

FIG. 2 illustrates an exemplary mixed cross point memory device that supports features and operations in accordance with examples of the present disclosure. Memory device 200 may be an example of memory device 100 described with reference to FIG. 1. Memory device 200 may include a first array or deck of cells 205 and second array or deck of cells 210 underlying the first array. Memory device 200 may, for example, include multiple decks of cells 205 and multiple decks of cells 210 (e.g., deck of cells 205-a and deck of cells 210-a). Multiple decks of cells 205 may be located adjacent to each other and multiple decks of cells 210 may also be located adjacent to each other. Device 200 may also include word line 110-a and word line 110-b, and bit line 115-a, which may be examples of word line 110 and bit line 115, as described with reference to FIG. 1. First memory cell 205 may have a self-selecting memory storage element and may overlie second memory cell 210. Alternatively, second memory cell 210 may overlie first memory cell 205.

First memory cell 205 may include first electrode 215, at least one memory storage element 220, and second electrode 225. Memory storage element 220 may be referred to as first memory storage element 220 and may be a self-selecting memory storage element. Additionally, first electrode 215 may be referred to as top electrode 215 and second electrode 225 may be referred to as bottom electrode 225.

Second memory cell 210 may include third electrode 230, memory storage element 235, fourth electrode 240, at least one selector device 245, and fifth electrode 250. Memory storage element 235 may be referred to as second memory storage element 235. Additionally, third electrode 230 may be referred to as top electrode 230, fourth electrode 240 may be referred to as middle electrode 240, and fifth electrode 250 may be referred to as bottom electrode 250. In some cases (not shown), the relative position of the second memory storage element and selector device may be interchanged. In other cases, at least one of memory storage element 220 or memory storage element 235 may contain a phase change material (PCM).

First memory cell 205 and second memory cell 210 may, in some examples, have common conductive lines such that each deck of which cells 205 and 210 are respectively associated may share word lines 110 or bit lines 115 as described with reference to FIG. 1. For example, bottom electrode 225 and top electrode 230 may be coupled to bit line 115-a such that bit line 115-a is shared by first memory cell 205 and second memory cell 210. A first memory deck that includes first memory cell 205 and a second memory deck that includes second cell 210 may thus share bit line 115-a. In some examples, first memory deck and second memory deck may be coupled to individual bit lines.

The architecture of memory device 200 may be referred to as a cross-point architecture. It may also be referred to as a pillar structure that may be arranged in a three-dimensional cross point architecture. For example, as shown in FIG. 2, at least one pillar (e.g., first memory deck that includes first memory cell 205) may be in contact with a first conductive line (e.g., word line 110-a) and a second conductive line (e.g., bit line 115-a), where the pillar comprises a top electrode 215, memory storage element 220, and bottom electrode 225. A second pillar (e.g., second memory deck that includes second memory cell 210) may be in contact with a first conductive line (e.g., bit line 115-a) and a second conductive line (e.g., word line 110-b), where the pillar includes top electrode 230, memory storage element 235, middle electrode 240, selector device 245, and bottom electrode 250. In some examples, the first and second pillars may be described as a single pillar.

Such a pillar architecture may offer relatively high-density data storage with lower production costs compared to other memory architectures. For example, the cross-point architecture may have memory cells with a reduced area and, resultantly, an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

As mentioned, multiple memory cells 205 or cells 210 may be referred to as a memory array. So the first array may be or may include a first deck of a three-dimensional cross point memory architecture and the second array may include a second deck of the three-dimensional cross point memory architecture. The first deck may have a first pitch that is different from a second pitch of the second deck in at least one direction. The first memory deck and second memory deck may be coupled together via a common access line (e.g., bit line 115-a).

Memory storage element 220 may be connected in series between top electrode 215 and bottom electrode 225. First memory cell 205 may, in some cases, be connected between a first access line (e.g., word line 110-a) and a second access line (e.g., bit line 115-a).

Selector device 245 may be connected in series between middle electrode 240 and bottom electrode 250. Further, memory storage element 235 may be connected in series between top electrode 230 and middle electrode 240. Second memory cell 210 may, in some cases, be connected between a second access line (e.g., bit line 115-a) and a third access line (e.g., word line 110-b). Other configurations are possible. For example, a fourth access line may be isolated from the second access line (e.g., bit line 115-a) in a three-dimensional cross point architecture. In some examples, the memory storage element 235 may be coupled to the fourth access line. In another example, selector device 245 may be located in series between top electrode 230 and middle electrode 240 and memory storage element 235 may be located in series between middle electrode 240 and bottom electrode 250. Further, second memory cell 210 may be located between word line 110-a and bit line 115-a and first memory cell 205 may be located between bit line 115-a and word line 110-b.

Memory storage element 220 may, for example include a first chalcogenide material having a first composition. Memory storage element 235 may include a second chalcogenide material having a second composition different from the first composition. Selector device 245 may contain a third chalcogenide material having a second composition that may be different from the composition of the first chalcogenide material. Alternatively, the composition of the chalcogenide material of memory storage element 220 and memory storage element 235 may be the same. In some examples, one or both of memory cell 205 and memory cell 205 may be at least one of a resistive random-access memory (RRAM) cell, a conductive-bridging random-access memory (CBRAM) cell, phase change memory (PCM) cell, or a spin-transfer torque random-access memory (STT-RAM) cell, among other types of memory cells. In some cases, selector device 245 is a chalcogenide film, for example, an alloy of selenium (Se), arsenic (As), silicon (Si), Tellurium (Te), and germanium (Ge). Memory storage element 220 may have a same or similar composition as selector device 245.

In some examples, selector device 245 is an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. Selector device 245 may be separated from memory element 235 by middle electrode 240. As such, middle electrode 240 may electrically float—that is, charge may accumulate because it may not be directly connected to an electrical ground or a component capable of being electrically grounded.

Memory device 200 may be made by various combinations of material formation and removal. For example, layers of material may be deposited that correspond to the word line 110-a, first electrode 215, memory storage element 220, bottom electrode 225, top electrode 230, memory storage element 235, middle electrode 240, selector device 245, bottom electrode 250, and word line 110-b. Material may be selectively removed to then create the desired features, such as the pillar structure depicted in FIG. 2. For example, features may be defined using photolithography to pattern a photoresist and then material may be removed by techniques such as etching. Bit line 115-a may then be formed, for example, by depositing a layer of material and selectively etching to form the line structure depicted in FIG. 2. In some cases, electrically insulating regions or layers may be formed or deposited. The electrically insulating regions may include oxide or nitride materials, such as silicon oxide, silicon nitride, or other electrically insulating materials.

Various techniques may be used to form materials or components of memory device 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

Figure 3:
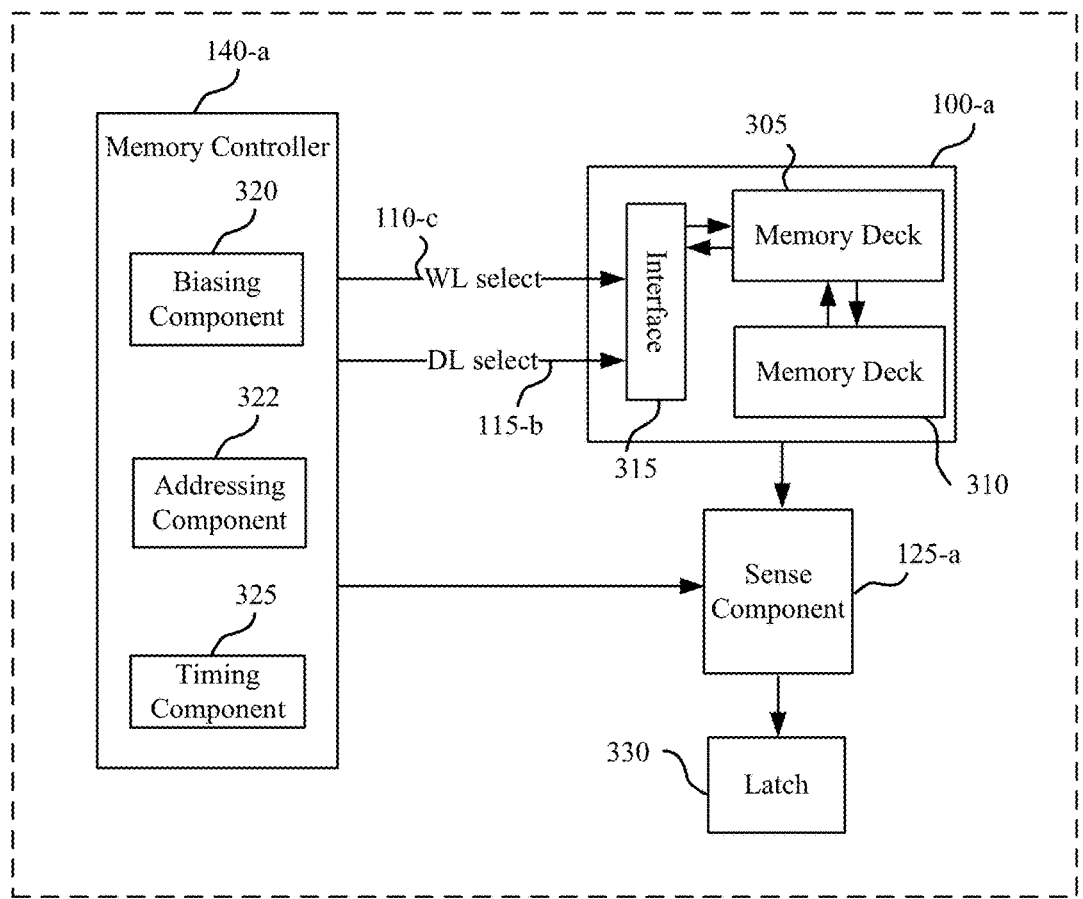
FIG. 3 illustrates an exemplary mixed cross point memory device that supports features and operations in accordance with examples of the present disclosure.

FIG. 3 shows an exemplary mixed cross point memory device 300 that supports features and operations in accordance with examples of the present disclosure. Device 300 may be referred to as an electronic memory apparatus.

Memory device 100-a may include a first memory deck 305 and second memory deck 310. First memory deck 305 may include an array of cells similar to first cell 205 described with reference to FIG. 2. Second memory deck 310 may include an array of cells similar to second cell 210 described with reference to FIG. 2. First memory deck 305 may be coupled to second memory deck 310. First memory deck 305 may include a first memory cell that includes at least one self-selecting memory storage element coupled between a first access line and a second access line, and second memory deck 310 may include a second memory cell that includes a memory storage element and a selector device, the second memory cell coupled between the second access line and a third access line.

Memory device 100-a may further include interface 315 that is coupled to first memory deck 305 and to word line 110-c select and digit line 115-b select. Word line 110-c select and digit line 115-b select may one or more busses. That is, while depicted in FIG. 3 as separate physical connections, they may occupy logically distinct by physically common traces or lines within a device. Interface 315 may also be referred to as control circuitry and may be oriented such that the first array and the second array overlie interface 315. These components may be in electronic communication with each other and may perform one or more of the functions described herein. In some cases, memory controller 140-a may include biasing component 320, addressing component 322, and timing component 325. Memory controller 140-a may be in electronic communication with word line select 110-c, digit line 115-b select, and sense component 125-a, which may be examples of or associated with word line 110, digit line 115, and sense component 125, as described with reference to FIGS. 1 and 2. In some cases, sense component 125-a and latch 330 may be components of memory controller 140-a.

In some examples, digit line 115-b is in electronic communication with sense component 125-a and memory device 100-a. A logic state (e.g., a first or second logic state) may be written to a memory cell in a first memory deck 305 and a memory cell in a second memory deck 310-b. Word line 110-c select may be in electronic communication with memory controller 140-a and memory device 100-a. Sense component 125-a may be in electronic communication with memory controller 140-a, digit line 115-b select, and latch 330. These components may also be in electronic communication with other components, both inside and outside of memory array device, in addition to components not listed above, via other components, connections, or busses.

Memory controller 140-a may be configured to activate word line 110-c select or digit line 115-b select by applying voltages or digital inputs to those various nodes. For example, addressing component 322 may be configured to provide an address and/or command to memory array device to read or write a memory cell or memory cells in first memory deck 305 and second memory deck 310 as described above. In some cases, memory controller 140-a may include a row decoder, column decoder, or both, as described with reference to FIG. 1. This may enable memory controller 140-a to access one or more memory cells. Biasing component 320 may provide a voltage for the operation of sense component 125-a.

Interface 315 may be coupled to memory controller 140-a via word line 110-c select and digit line 115-b select. Interface 315 (or another portion of a chip of which interface 315 may be a component) may receive address and/or command information from addressing component 322 and may determine what bias or timing, or both, to apply to access lines within memory deck 305 and memory deck 310. Interface 315 may be configured to write a first logic value to a memory storage element of a cell of the first memory deck 305 (e.g., to memory storage element 220 of FIG. 2). A first state may be written to the cell in the first memory deck 305 using a first polarity. Similarly, interface 315 may be configured to write a second logic value to a memory storage element of a cell of the second memory deck 310 (e.g., to memory storage element 235 of FIG. 2). A first state may be written to the second memory deck 310 using a second polarity. Additionally, interface 315 may be configured to write a third logic value to the second memory deck 310 using a second polarity. Alternatively, for example, interface 315 may be configured to write a fourth logic value to the cell in the first memory deck 305 using a second polarity. The second polarity may be opposite the first polarity. Either the second logic value or the third logic value, or both, may be based at least in part on a waveform of a voltage pulse applied to the cell of memory deck 305 or memory deck 310.

Interface 315 may be configured to read the first logic value written to the first memory deck 305 and the second logic value written to the second memory deck 310. The logic values may be read using a second polarity, which may be opposite of the first polarity. Due to the configuration of interface 315, two or more logic values may be written to or read from memory deck 305 or memory deck 310, or both.

In some cases, memory controller 140-a may perform its operations using timing component 325. For example, timing component 325 may control the timing of the various word line and digit lines selections and/or biasing, including timing for switching and voltage application to perform the memory functions, such as reading and writing, discussed herein. In some cases, timing component 325 may control the time of operations of biasing component 320.

Upon determining a logic state of cells in first memory deck 305 and/or second memory deck 310-b, the sense component 125-a may store the output in latch 330, where it may be used in accordance with the operations of an electronic device that includes memory device 300 is a part. Sense component 125-a may include a sense amplifier in electronic communication with the latch and memory device 100-a.

Memory controller 140-a, or at least some of its various sub-components may be implemented in hardware, software executed by a processor, firmware, or any combination thereof. If implemented in software executed by a processor, the functions of the memory controller 140-a, or at least some of its various sub-components, may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 140-a, or at least some of its various sub-components, may be physically located at various positions, including being distributed such that portions of functions are implemented at different physical locations by one or more physical devices. In some examples, memory controller 140-a, or at least some of its various sub-components, may be a separate and distinct component in accordance with various examples of the present disclosure. In other examples, memory controller 140-a, or at least some of its various sub-components, may be combined with one or more other hardware components, including but not limited to a receiver, a transmitter, a transceiver, one or more other components described in the present disclosure, or a combination thereof in accordance with various examples of the present disclosure.

Figure 4:
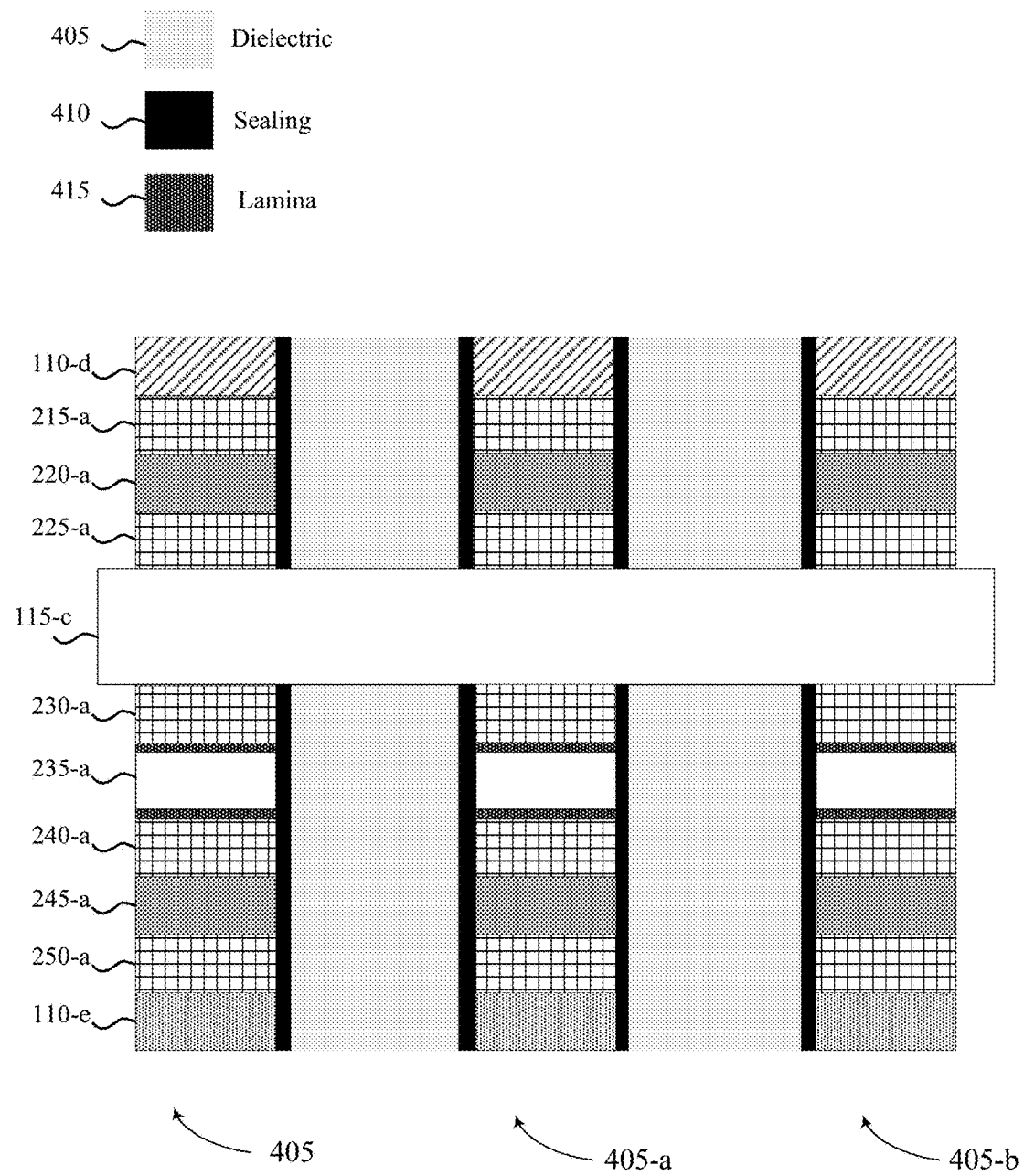
FIG. 4 illustrates an exemplary mixed cross point memory device that supports features and operations in accordance with examples of the present disclosure.

FIG. 4 illustrates an exemplary mixed cross point memory device that supports features and operations in accordance with examples of the present disclosure. Memory columns 405, 405-a, and 405-b may be an example of a pillar that includes a first memory cell 205 coupled to second memory cell 210 via digit line 115-a, as described with reference to FIG. 2. Memory columns 405, 405-a, and 405-b may contain similar features.

Memory column 405 may include top electrode 215-a, memory storage element 220-a, and bottom electrode 225-a. Top electrode 215-a, memory storage element 220-a, and bottom electrode 225-a may be examples of top electrode 215, memory storage element 220, and bottom electrode 225 described with reference to FIG. 2. Memory storage element 220-a may be located between and coupled to top electrode 215-a and bottom electrode 225-a. Further, top electrode 215-a and bottom electrode 225-a may include a same or a different electrically conductive material.

Memory column 405 may include word line 110-d and digit line 115-c. Word line 110-d and digit line 115-c may be an example of word line 110-a and digit line 115-a as described with reference to FIG. 2. Top electrode 215-a may be coupled to word line 110-d and may include tungsten (W). Additionally, bottom electrode 225-a may be coupled to digit line 115-c. Digit line 115-c may include a same or different electrically conductive material or materials as word line 110-d.

Memory column 405 may further include top electrode 230-a, middle electrode 240-a, bottom electrode 250-a, memory storage element 235-a, and selector device 245-a. Top electrode 230-a, middle electrode 240-a, bottom electrode 250-a, memory storage element 235-a, and selector device 245-a may be examples of top electrode 230, middle electrode 240, bottom electrode 250, memory storage element 235, and selector device 245 as described with reference to FIG. 2. Memory column 405 may further include lamina 415.

Memory storage element 235-a may be located between top electrode 230-a and middle electrode 240-a. Memory storage element 235-a may be separated from the electrodes by lamina 415. Lamina 415 may be a first lamina and second lamina. The first lamina may separate top electrode 230-a and memory storage element 235-a and the second lamina may separate top memory storage element 235-a and middle electrode 240-a. Lamina 415 may, for example, serve as an insulating layer, adhesion layer, or a barrier.

Selector device 245-a may be located between and coupled to middle electrode 240-a and bottom electrode 250-a. Selector device may include a chalcogenide material. Further, top electrode 230-a, middle electrode 240-a, and bottom electrode 250-a may include a same or different electrically conductive material or composition of materials.

Memory column 405 may further be lined by sealing material 410. Sealing material may include a composition that includes silicon nitride. Additionally, memory columns 405, 405-a, and 405-b may be separated by a dielectric material.

Figure 5:
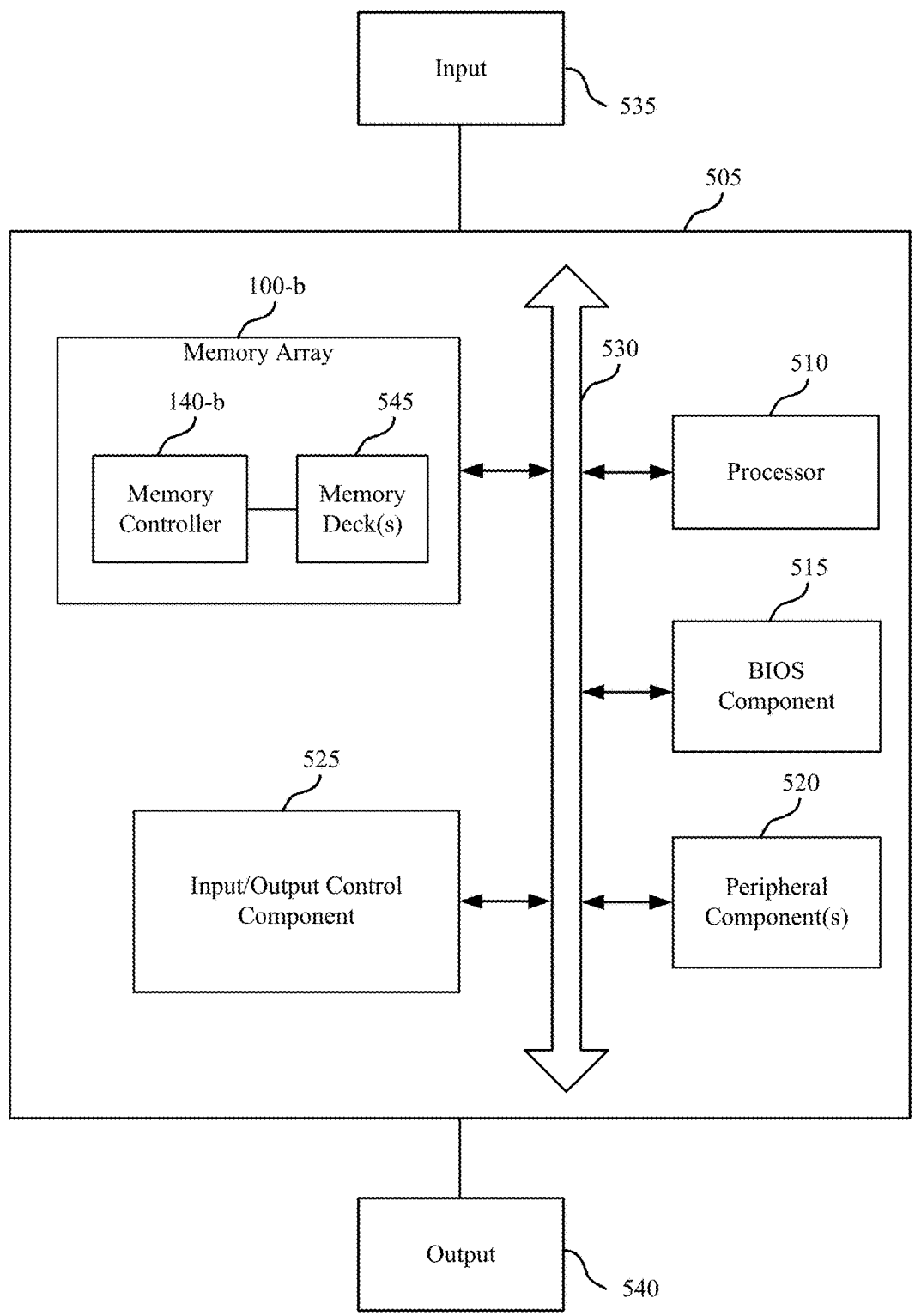
FIG. 5 illustrates an exemplary mixed cross point memory device that supports features and operations in accordance with examples of the present disclosure.

FIG. 5 illustrates an exemplary mixed cross point memory device that supports features and operations in accordance with examples of the present disclosure. Device 505 may be an example of or include the components of memory controller 140 as described above, with reference to FIG. 1. Device 505 may include components for bi-directional voice and data communications including components for transmitting and receiving communications, including memory device 100-b that includes memory controller 140-b and memory deck 545, basic input/output system (BIOS) component 515, processor 510, I/O controller 525, and peripheral components 520. Memory deck 545 may be an example of first memory deck 305 and second memory deck 310 described with reference to FIG. 3; each may include cells 205 and 210, respectively, as described with reference to FIG. 2. These components may be in electronic communication via one or more busses (e.g., bus 530). Memory cells 105-e may store information (i.e., in the form of a logical state) as described herein.

BIOS component 515 may be a software component that includes BIOS operated as firmware, which may initialize and run various hardware components. BIOS component 515 may also manage data flow between a processor and various other components, for example, peripheral components, input/output control component, etc. BIOS component 515 may include a program or software stored in read only memory (ROM), flash memory, or any other non-volatile memory.

Processor 510 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 510 may be configured to operate a memory array using a memory controller. In other cases, a memory controller may be integrated into processor 510. Processor 510 may be configured to execute computer-readable instructions stored in a memory to perform various functions (e.g., functions or tasks supporting multi-deck memory arrays).

I/O controller 525 may manage input and output signals for device 505. I/O controller 525 may also manage peripherals not integrated into device 505. In some cases, I/O controller 525 may represent a physical connection or port to an external peripheral. In some cases, I/O controller 525 may utilize an operating system such as iOS®, ANDROID®, MS-DOS®, MS-WINDOWS®, OS/2®, UNIX®, LINUX®, or another known operating system.

Peripheral components 520 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 535 may represent a device or signal external to device 505 that provides input to device 505 or its components. This may include a user interface or an interface with or between other devices. In some cases, input 535 may be managed by I/O controller 525, and may interact with device 505 via a peripheral component 520.

Output 540 may also represent a device or signal external to device 505 configured to receive output from device 505 or any of its components. Examples of output 540 may include a display, audio speakers, a printing device, another processor or printed circuit board, etc. In some cases, output 540 may be a peripheral element that interfaces with device 505 via peripheral component(s) 520. In some cases, output 540 may be managed by I/O controller 525

The components of device 505 may include circuitry designed to carry out their functions. This may include various circuit elements, for example, conductive lines, transistors, capacitors, inductors, resistors, amplifiers, or other active or inactive elements, configured to carry out the functions described herein. Device 505 may be a computer, a server, a laptop computer, a notebook computer, a tablet computer, a mobile phone, a wearable electronic device, a personal electronic device, or the like. Or device 505 may be a portion or component of such a device.

Figure 6:
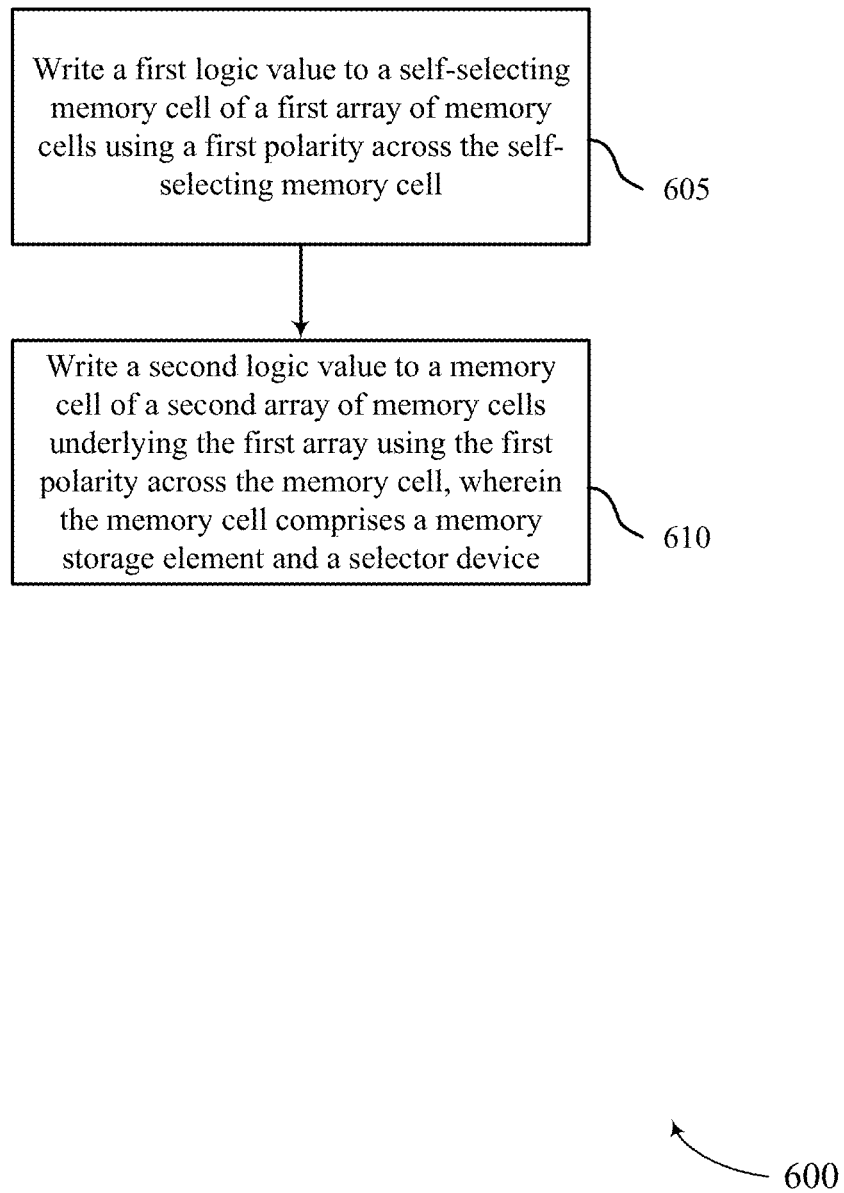
FIG. 6 is a flowchart that illustrates a method or methods for operating mixed multi-deck cross point memory in accordance with examples of the present disclosure.

FIG. 6 shows a block diagram 600 of a method or methods for operating a multi-deck memory device that supports a multi-deck memory array in accordance with examples of the present disclosure. For example, within a multi-deck memory array, each deck may be operated in either polarity (i.e., positive or negative relative to a reference) such that each deck may be programmed and/or read in both polarities.

The operations of method 600 may be implemented by a memory controller or its components as described herein. For example, the operations of method 600 may be performed by a memory controller as described with reference to FIG. 3. In some examples, a memory controller may execute a set of codes to control the functional elements of the device to perform the functions described below. Additionally or alternatively, the memory controller may perform some or all of the functions described below using special-purpose hardware.

At bock 605, the method may include writing a first logic value to a self-selecting memory cell of a first array of memory cells using a first polarity across the self-selecting memory cell. The operations of block 605 may be performed by memory controller 140-*a* as described with reference to FIG. 3.

At block 610, the method may include writing a second logic value to a memory cell of a second array of memory cells underlying the first array using the first polarity across the memory cell. The memory cell may comprise a memory storage element and a selector device. The operations of block 610 may be performed by memory controller 140-*a* as described with reference to FIG. 3. In certain examples, the second logic value may be written in response to the first logic value. For example, the second logic value may be redundant to the first logic value The method may also include reading the first logic value from the self-selecting memory cell using a first polarity or a second polarity across the self-selecting memory cell, the second polarity opposite the first polarity and reading the second logic value from the memory cell of the second array using the first polarity or the second polarity across the memory cell. In certain examples, the first logic value and the second logic value may each include a separate bit, and each bit more correspond to a one-bit logic state. In certain examples, the first logic value and the second logic value each comprise one bit of a two-bit logic state. Additionally, the first logic value and the second logic value may include a same value and the memory controller 140-*a* may be able to write the second logic value redundant to the first logic value. In further examples, the self-selecting memory cell of the first array and the memory cell of the second array may be single-bit cells. In other examples, at least one of the self-selecting memory cell of the first array and the memory cell of the second array may be a multi-level cell (MLC).

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refers to a relationship between components that supports electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Chalcogenide materials may be materials or alloys that include at least one of the elements sulfur (S), selenium (Se), and tellurium (Te). Phase change materials discussed herein may be chalcogenide materials. Chalcogenide materials and alloys may include, but not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
    a first array of memory cells that comprises at least one self-selecting memory storage element;
    a second array of memory cells that comprises at least one memory storage element and at least one selector device, wherein the first array is coupled to the second array; and
    control circuitry coupled to the first array and the second array, wherein at least one of the first array or the second array overlie at least a portion of the control circuitry.

2. The memory device of claim 1, wherein at least one memory cell of the second array is coupled to a same access line as at least one memory cell of the first array and the control circuitry is coupled to the same access line as the first array and the second array.

3. The memory device of claim 1, wherein at least one memory cell of the first array is coupled to a first access line, at least one memory cell of the second array is coupled to a second access line different from the first access line, and wherein the control circuitry is coupled to the first access line and the second access line.

4. The memory device of claim 1, wherein the first array comprises a first deck of a three-dimensional cross point memory architecture and the second array comprises a second deck of the three-dimensional cross point memory architecture.

5. The memory device of claim 4, wherein a first pitch of the first deck is different from a second pitch of the second deck in at least one direction.

6. The memory device of claim 4, wherein a first pitch of the first deck and a second pitch of the second deck comprise a same pitch in at least one direction.

7. The memory device of claim 1, wherein the at least one self-selecting memory storage element of each cell of the first array and the at least one selector device and the at least one memory storage element of each cell of the second array each comprise a chalcogenide material.

8. The memory device of claim 7, wherein the at least one memory storage element comprises a phase change material (PCM).

9. The memory device of claim 7, wherein the at least one self-selecting memory storage element comprises a first chalcogenide material having a first composition and selector device comprises a second chalcogenide material having a second composition different from the first composition.

10. The memory device of claim 1, wherein each cell of the first array is aligned with at least one cell of the second array.

* * * * *